(12) United States Patent
Ek et al.

(10) Patent No.: US 7,893,856 B2
(45) Date of Patent: Feb. 22, 2011

(54) DIGITAL-TO-ANALOG CONVERSION CIRCUIT

(75) Inventors: Staffan Ek, Malmö (SE); Stefan Andersson, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 8 days.

(21) Appl. No.: 12/423,991

(22) Filed: Apr. 15, 2009

(65) Prior Publication Data

US 2010/0265112 A1 Oct. 21, 2010

(51) Int. Cl.
 *H03M 1/66* (2006.01)
(52) U.S. Cl. .................. 341/144; 341/145; 341/146; 341/147
(58) Field of Classification Search .......... 341/144–147
 See application file for complete search history.

(56) References Cited

U.S. PATENT DOCUMENTS

| 5,323,157 A | 6/1994 | Ledzius et al. |
| 6,624,774 B2 | 9/2003 | Takeda et al. |
| 7,253,760 B2* | 8/2007 | Yamashita .................. 341/144 |
| 2008/0159374 A1* | 7/2008 | Lin et al. .................... 375/232 |

OTHER PUBLICATIONS

Carbone, P. et al. "Conversion Error in D/A Converters Employing Dynamic Element Matching." 1994 IEEE International Symposium on Circuits and Systems (ISCAS '94), May 30-Jun. 2, 1994, vol. 2, pp. 13-16, London, UK.

Jerng, A. et al. "A Wideband ΔΣ Digital-RF Modulator for High Data Rate Transmitters." IEEE Journal of Solid-State Circuits, vol. 42, No. 8, Aug. 2007, pp. 1710-1722.

Barkin, D. B. et al. "A CMOS Oversampling Bandpass Cascaded D/A Converter with Digital FIR and Current-Mode Semi-Digital Filtering." IEEE Journal of Solid-State Circuits, vol. 39,. No. 4, Apr. 2004, pp. 585-593.

Harris, F. "Performance and Design of Farrow Filter Used for Arbitrary Resampling." 1997 13th International Conference on Digital Signal Processing Proceedings (DSP 97), Jul. 2-4, 1997, vol. 2, pp. 595-599, Santorini, Greece.

Clara, M. et al. "A 1.5V 13bit 130-300MS/s Self-calibrated DAC with Active Output State and 50MHz Signal Bandwidth in 0.13 μm CMOS." 34th European Solid-State Circuits Conference, 2008 (ESSCIRC 2008), Sep. 15-19, 2008, pp. 262-265.

Schreier, R. "Chapter 7—Delta-Sigma DACs." Understanding Delta-Sigma Data Converters. John Wiley & Sons, Inc., Hoboken, New Jersey, 2005, pp. 219-228.

* cited by examiner

*Primary Examiner*—Jean B Jeanglaude
(74) *Attorney, Agent, or Firm*—Coats & Bennett, PLLC.

(57) ABSTRACT

A digital-to-analog conversion circuit includes a first digital-to-analog converter (DAC), a second DAC, and a control circuit to select which DAC to use for digital-to-analog conversion of a digital signal. Concerned with the noise level produced at a given out-of-band frequency, the control circuit bases its selection of DACs, at least in part, on a frequency distance between the given out-of-band frequency and the digital signal's frequency. The control circuit, for example, may select the DAC producing the lowest noise level at that frequency distance, or, if both DACs are able to reduce noise to a level below a noise tolerance specified for the frequency distance, the DAC consuming the least power. To reduce the chip area required for the digital-to-analog conversion circuit, the first and second DACs advantageously have topologies that permit them to share common components (e.g., DAC unit elements).

20 Claims, 5 Drawing Sheets

US 7,893,856 B2

DIGITAL-TO-ANALOG CONVERSION CIRCUIT

TECHNICAL FIELD

The present invention generally relates to digital-to-analog conversion methods and apparatus, and particularly relates to suppressing conversion noise at a given out-of-band frequency.

BACKGROUND

A digital-to-analog converter (DAC) converts a digital signal into an analog signal. This conversion, however, introduces some amount of conversion noise into frequencies other than that of the digital signal. The level of noise emitted in any given out-of-band frequency affects the quality of signals occupying that frequency, at least to the extent the noise level exceeds a specified tolerance for noise.

Conventional or Nyquist-rate DACs, while having relatively low sampling rates and power consumption, do little by themselves to suppress the level of noise introduced into a given out-of-band frequency. Although increasing the DACs' resolution generally lowers the level of noise introduced, analog design complexity and chip area restrictions limit the amount by which the noise level can be lowered.

Without the same design complexity and area restrictions, noise shaping DACs significantly decrease the level of noise introduced within a certain bandwidth by moving noise from lower to higher frequencies. However, noise shaping DACs require oversampling of the digital signal, and, thus, may consume more power than a conventional DAC. This oversampling also limits the frequencies at which noise shaping DACs can effectively decrease noise levels.

Accordingly, none of the above-described conversion approaches are entirely advantageous under all circumstances and for all out-of-band frequencies.

SUMMARY

Methods and apparatus taught herein advantageously select between multiple digital-to-analog conversion approaches to suppress conversion noise in a given out-of-band frequency. More particularly, the effectiveness with which different conversion approaches suppress out-of-band noise in a given out-of-band frequency varies as a function of the distance between the frequency of the digital signal being converted and the given out-of-band frequency. Accordingly, methods and apparatus taught herein select between multiple digital-to-analog converters based on this frequency distance.

In one or more embodiments presented herein, a digital-to-analog conversion circuit includes multiple digital-to-analog converters (DACs) and a control circuit to select which DAC to use for digital-to-analog conversion of a digital signal. Each of the DACs have different out-of-band noise characteristics. For example, one DAC may be a Nyquist-rate DAC with a white noise characteristic, while another DAC is an oversampling DAC with a shaped noise characteristic. According to these characteristics, the noise level produced by each DAC at a given out-of-band frequency varies as a function of the frequency distance between that given out-of-band frequency and the frequency of the digital signal being converted. Concerned with the noise level produced at a given out-of-band frequency, therefore, the control circuit bases its selection of DACs on the frequency distance between that given out-of-band frequency and the digital signal's frequency.

In various embodiments, the control circuit bases its selection solely on the frequency distance. The control circuit may, for example, be preconfigured to automatically select between DACs based on a mapping of possible frequency distance values to different DACs. In other embodiments, the control circuit further bases its selection on a noise level tolerance for the frequency distance and the power consumption of each DAC. For instance, the control circuit may select the DAC consuming the least power if both DACs are able to reduce noise to a level below a specified noise tolerance.

The conversion circuit taught herein may be part of a wireless communications device using frequency division duplexing between a transmitter and receiver. In one embodiment, the duplex distance is variable based on operation by the wireless communications device according to one of several communication standards. In order to reduce the noise level produced at a duplex distance corresponding to a certain communication standard, the control circuit selects between DACs based on that duplex distance.

In certain embodiments, the DACs advantageously have topologies that permit them to share common components in order to reduce the chip area required for the digital-to-analog conversion circuit. In one embodiment, for example, the DACs may include different sets of digital bits driving the same array of DAC unit elements. In this case, the control circuit selects between DACs by selecting to drive the array of DAC unit elements with a certain set of digital bits.

In a preferred embodiment, one DAC comprises a Nyquist-rate DAC that drives an array of equally weighted DAC unit elements with thermometer coded bits of the digital signal. Another DAC comprises a noise shaping FIR DAC that drives the same array of DAC unit elements with delayed versions of a noise shaped bit stream. In this case, the control circuit preferentially selects the noise shaping FIR DAC if the frequency distance is small (e.g., less than 80 MHz). Conversely, the control circuit preferentially selects the Nyquist-rate DAC if the frequency distance is large (e.g., greater than 80 MHz) or if the Nyquist-rate DAC produces a noise level below a noise level tolerance for that frequency distance.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
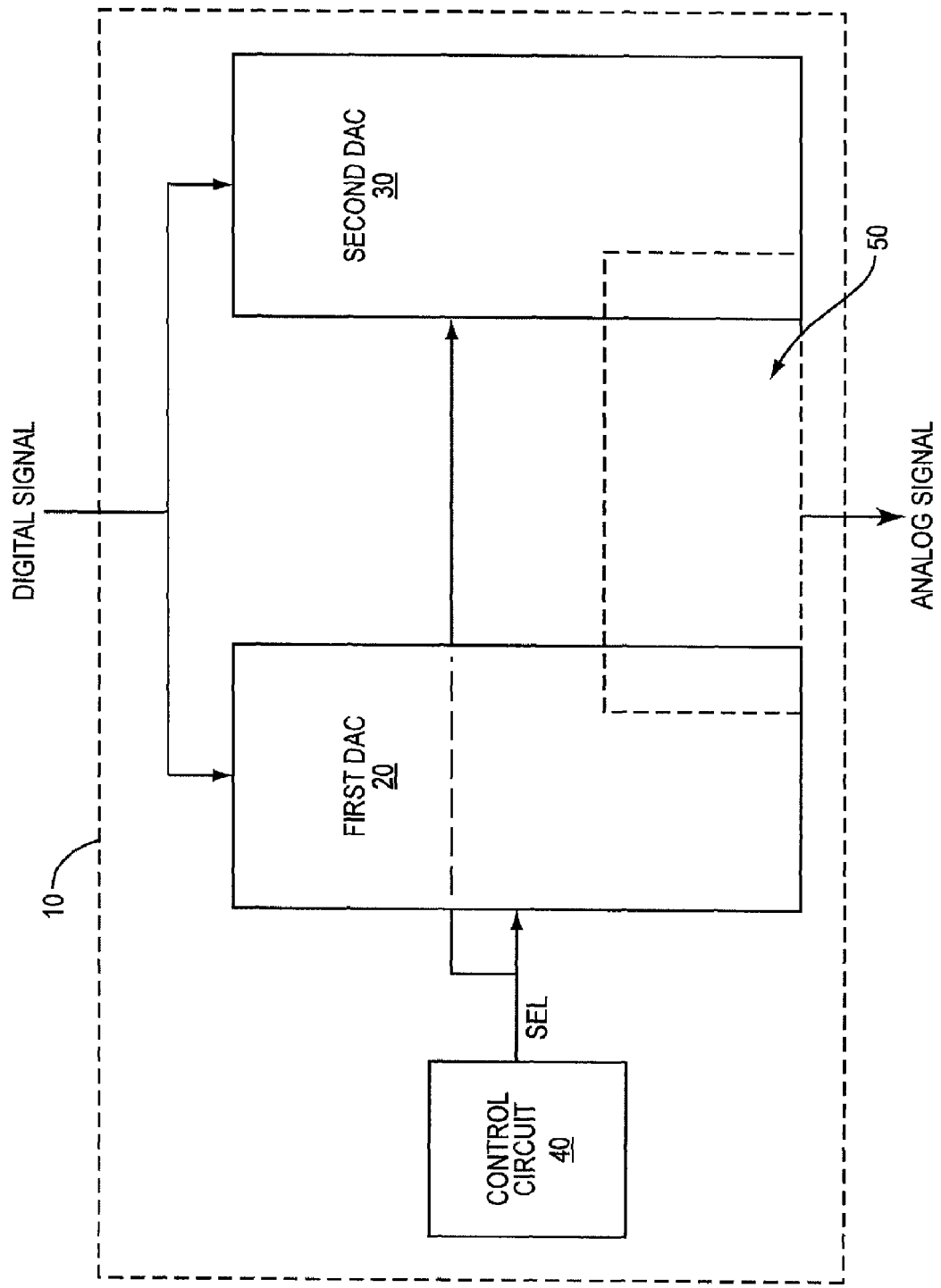
FIG. 1 is a block diagram illustrating one embodiment of a digital-to-analog conversion circuit of the present invention.

FIG. 1 illustrates one embodiment of a digital-to-analog conversion circuit 10, which converts a digital signal to an analog signal. The digital-to-analog conversion circuit 10 includes a first digital-to-analog converter (DAC) 20, a second DAC 30, optional common components 50 shared between the first and second DACs 20, 30, and a control circuit 40.

The control circuit 40 selects either the first DAC 20 or the second DAC 30 for digital-to-analog conversion of the digital signal. The first DAC 20, when selected to convert the digital signal, introduces conversion noise into out-of-band frequencies according to a first noise characteristic. Likewise, the second DAC 30, when selected, introduces conversion noise according to a second noise characteristic that is different than the first noise characteristic. The first and second DACs 20, 30, therefore, may comprise any types of DACs which produce different out-of-band noise characteristics upon converting the digital signal.

Figure 2:
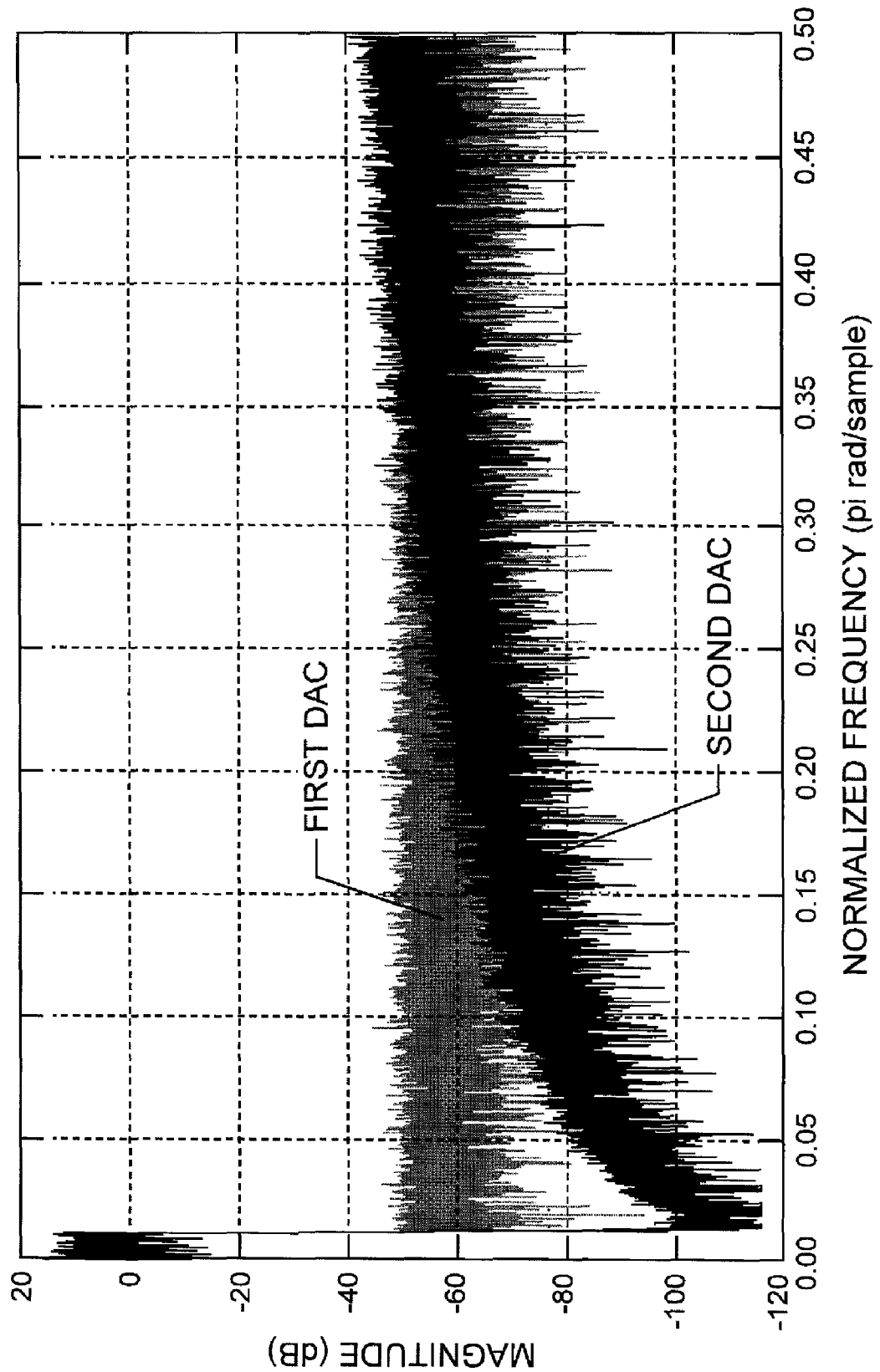
FIG. 2 is a waveform diagram comparing example out-of-band noise characteristics for the first and second digital-to-analog converters of FIG. 1.

For example, the first DAC 20 may comprise a Nyquist-rate DAC, which produces a white noise characteristic having approximately the same noise level across all out-of-band frequencies, and the second DAC 30 may comprise an oversampling DAC, which produces a noise shaped characteristic having higher noise levels at higher out-of-band frequencies. FIG. 2 illustrates this case for conversion of a digital baseband signal, but those skilled in the art will readily understand the present invention is not limited to baseband signals or the specific noise characteristics shown. FIG. 2 also does not take into account the affect error sources, such as transistor mismatch, may have on the noise characteristics. Indeed, FIG. 2 is provided merely as an aid in explaining the present invention.

According to each DAC's noise characteristic, each DAC 20, 30 produces a certain noise level at a given out-of-band frequency. The noise level produced by each DAC 20, 30, and the relation between those levels, varies as a function of the frequency distance between this given out-of-band frequency and the frequency of the digital signal being converted. If the frequency distance is small, for example, the second DAC 30 may produce a lower noise level than the first DAC 20. Again, FIG. 2 illustrates this example, wherein the second DAC 30 produces a lower noise level than the first DAC 20 if the frequency distance from the digital baseband signal is smaller than approximately 0.30 pi rad/sample.

Concerned with the noise level produced at a given out-of-band frequency, therefore, the control circuit 40 bases its selection between DACs 20, 30 on the frequency distance between that given out-of-band frequency and the digital signal's frequency. As explained in one or more embodiments below, this selection may be based solely on the frequency distance or only in part on the frequency distance.

In an embodiment where the selection is based solely on the frequency distance, the control circuit 40 is preconfigured to automatically select the first DAC 20 if the frequency distance has one value and to select the second DAC 30 if the frequency distance has another value. Such preconfiguration may include a look-up table mapping possible frequency distance values to different DACs 20, 30. In FIG. 2, for example, a possible frequency distance value of 0.10 pi rad/sample may be individually mapped to the second DAC 30 because that DAC produces a lower noise level at that frequency distance. On the other hand, a possible frequency distance value of 0.40 pi rad/sample may be individually mapped to the first DAC 20 because that DAC produces a lower noise level for that frequency distance. In this case, the relation between the noise levels produced by the DACs is stored inherently within a mapping of possible frequency distance values to DACs. So configured, the control circuit 40 selects between DACs 20, 30 based solely on comparing this mapping to the frequency distance.

Of course, instead of mapping individual values to DACs, such preconfiguration may alternatively include a preference to select one DAC or the other based on whether the frequency distance is within a certain range. In FIG. 2, for instance, the second DAC 30 has a noise shaped characteristic that produces a lower noise level for possible frequency distance values within its effective noise reduction bandwidth (i.e., within approximately 0.30 pi rad/sample). The control circuit 40 may be preconfigured, therefore, to preferentially select the second DAC 30 if the frequency distance is within this effective noise reduction bandwidth.

In other embodiments where the selection is based only in part on the frequency distance, the control circuit's 40 selection is further based on the noise level produced by each DAC 20, 30 at the frequency distance. Such selection may entail, for example, storing and/or comparing the noise levels produced by each DAC 20, 30 at the frequency distance. In one embodiment, the control circuit 40 compares these noise levels and selects the DAC producing the lowest noise level at the frequency distance.

However, selecting the DAC that produces the lowest noise level may unnecessarily consume additional power if both DACs 20, 30 are able to reduce noise to a level below a specified noise tolerance. In this case, the control circuit 40 may preferentially select the DAC that consumes the least power. In FIG. 2, for example, the first DAC 20 has a lower sampling rate, and may therefore consume less power, than the second DAC 30. Moreover, both DACs 20, 30 are able to reduce noise to below approximately −40 dB. Accordingly, if a specified noise tolerance indicates that a noise level of −40 dB will yield acceptable signal quality, the control circuit 40 may preferentially select the first DAC 20, even though the second DAC 30 produces the lowest noise level. In this embodiment, therefore, the control circuit 40 further bases its selection on a noise level tolerance and the power consumption (or an indicator thereof, such as sampling rate) of each DAC 20, 30.

Figure 3:
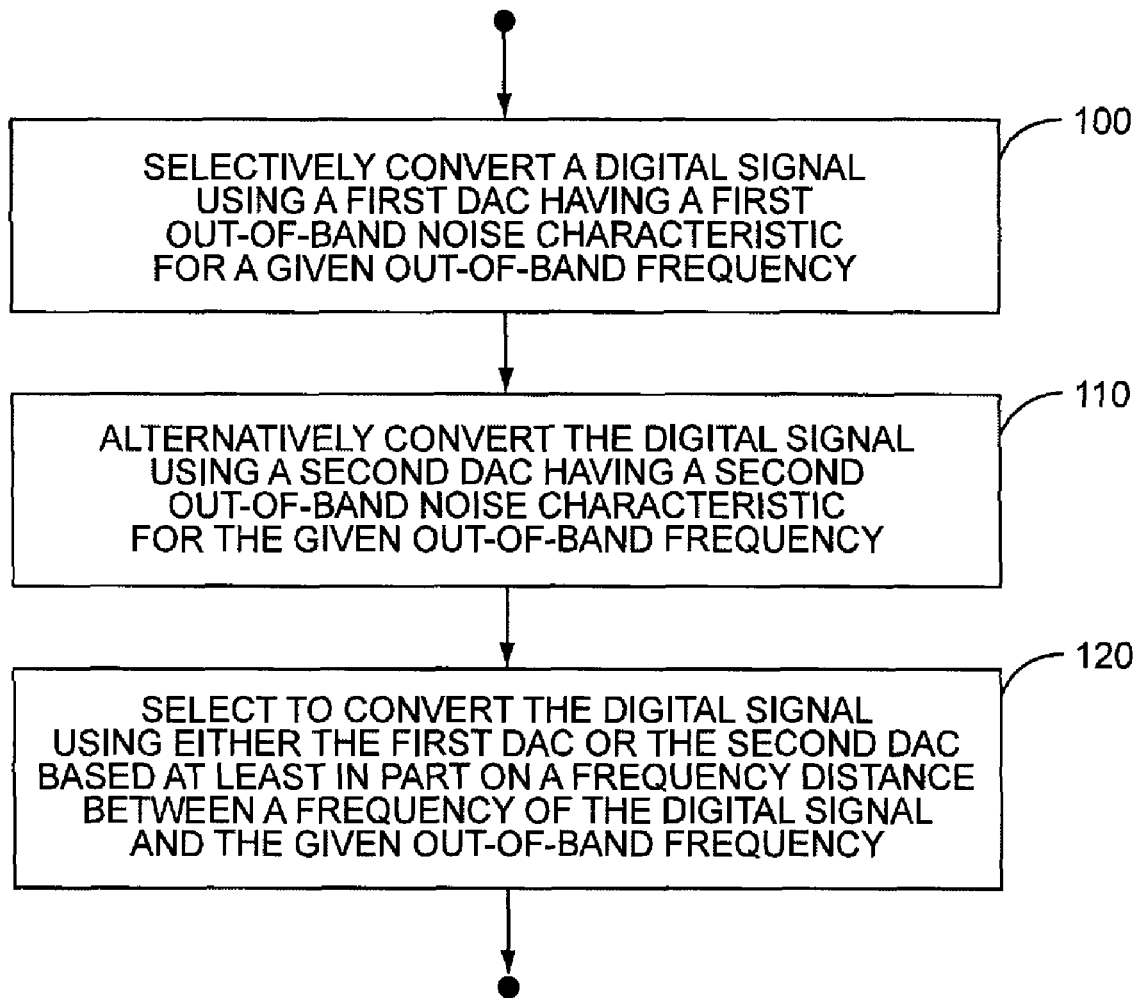
FIG. 3 is a logic flow diagram illustrating one embodiment of a method for converting a digital signal to an analog signal.

Thus, regardless of the precise manner in which the control circuit 40 bases its selection, or the other criteria used for that selection, the control circuit 40 fundamentally bases the selection between DACs 20, 30 on the frequency distance. Generally, then, the digital-to-analog conversion circuit 10 converts a digital signal to an analog signal according to the method shown in FIG. 3. In this method, the digital-to-analog conversion circuit 10 selectively converts the digital signal using a first DAC 20 that has a first out-of-band noise characteristic for a given out-of-band frequency (Block 100). Alternatively, the digital-to-analog conversion circuit 10 converts the digital signal using a second DAC 30 that has a second out-of-band noise characteristic for that given out-of-band frequency (Block 110). In selecting whether to convert the digital signal using the first DAC 20 or the second DAC 30, the digital-to-analog conversion circuit 10 bases that selection, at least in part, on the frequency distance between the frequency of the digital signal and the given out-of-band frequency (Block 120).

The above described method and conversion circuit 10 find particular utility where the conversion circuit 10 comprises part of a wireless communications transmitter in a wireless communications device. The conversion circuit 10 may, for example, select between the first and second DACs 20, 30 in order to reduce its effect on other frequency bands important to the wireless communications device (e.g., a GPS frequency or a receiving frequency).

More particularly, the wireless communications device may further include a wireless communications receiver and use frequency division duplexing to allow simultaneous transmission and reception. Accordingly, conversion noise introduced into out-of-band frequencies by the conversion circuit 10 may affect a signal at the receiving frequency of the transceiver, depending on the frequency distance between the receiving frequency and the frequency of the digital signal being converted and upconverted to its carrier frequency. This frequency distance is variable based on operation by the wireless communications device according to one of several communication standards.

In order to reduce the noise level produced at a frequency distance corresponding to a certain duplex distance, the control circuit 40 selects between the first and second DACs 20, 30 based on that frequency distance. If the first DAC 20 is a Nyquist-rate DAC and the second DAC 30 is an oversampled, noise-shaping DAC, for example, the control circuit 40 may select the first DAC 20 if the frequency distance is large (e.g., greater than 80 MHz). Conversely, the control circuit 40 may select the second DAC 30 if the frequency distance is small (e.g., less than 80 MHz) and the first DAC 20 produces a noise level above a noise level tolerance for that duplex distance.

Those skilled in the art will readily appreciate, however, other applications of the present invention beyond a wireless communications transmitter. Indeed, irrespective of this application, the conversion circuit 10 may be implemented according to various embodiments described below.

Figure 4:
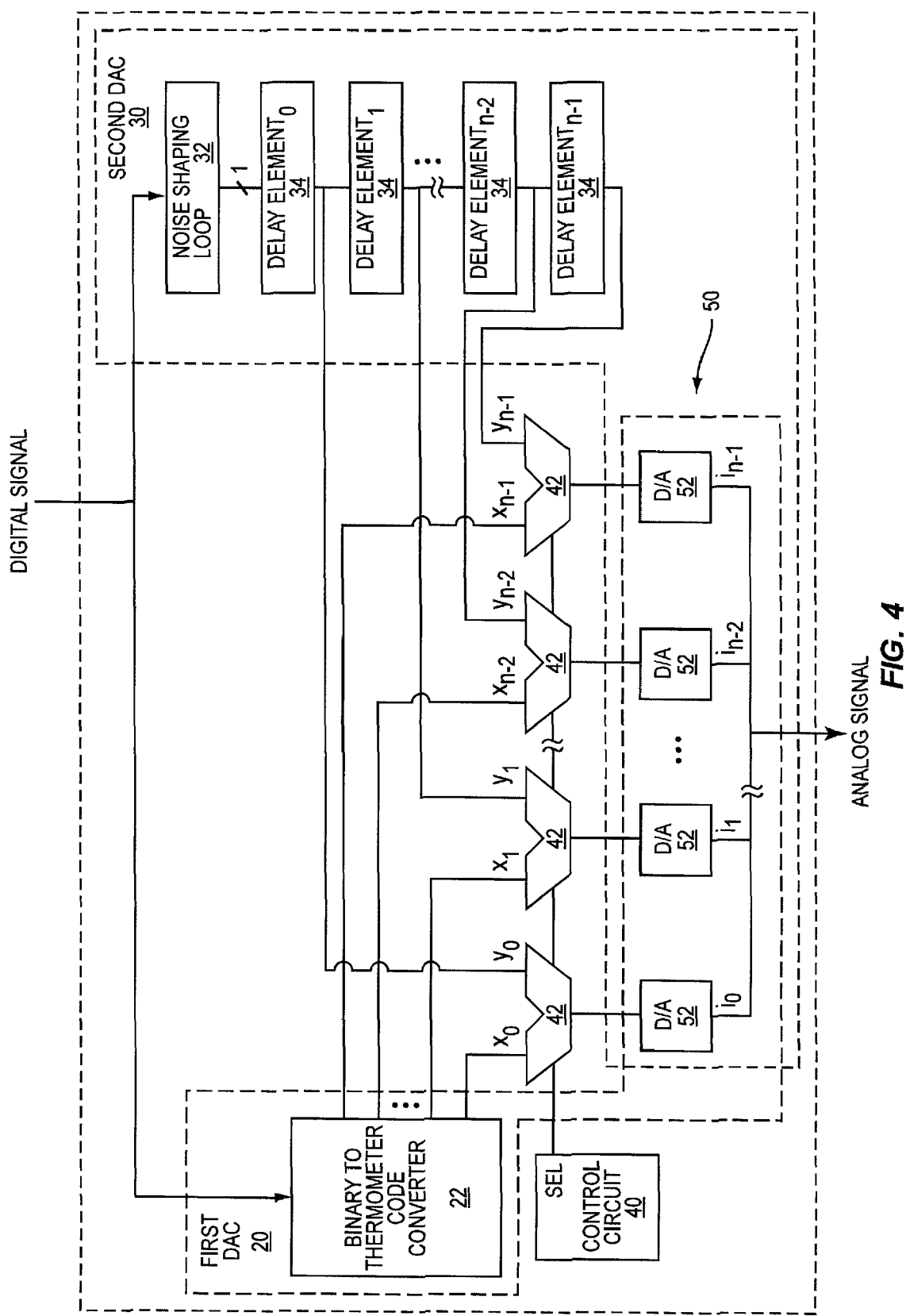
FIG. 4 is a schematic illustrating one embodiment of the digital-to-analog conversion circuit of FIG. 1.

In one embodiment, for example, DACs 20, 30 have entirely separate components. This embodiment, however, requires a larger chip area than other embodiments wherein the first and second DACs 20, 30 share common components 50. FIG. 4 illustrates such an embodiment that advantageously reduces the chip area required for the digital-to-analog conversion circuit 10.

In FIG. 4, the first DAC 20 includes an array of n equally weighted DAC unit elements 52 driven by a first set of digital bits $x_0, x_1, \ldots x_{n-2}, x_{n-1}$. This array of equally weighted DAC unit elements 52 is a common component 50 which is shared by the second DAC 30. Sharing of DAC unit elements in this way minimizes the number of redundant components in the digital-to-analog conversion circuit 10, and, therefore, reduces its chip area. Accordingly, the second DAC 30 includes that same array of n equally weighted DAC unit elements 52 driven by a second set of digital bits $y_0, y_1, \ldots, y_{n-2}, y_{n-1}$.

In order to select between the DACs 20, 30 for conversion of the digital signal, the control circuit 40 selects to drive the array of equally weighted DAC unit elements 52 with either the first or the second set of digital bits, respectively. More particularly, the digital-to-analog conversion circuit 10 further includes an array of multiplexers 42. This array of multiplexers 42 may be considered part of the control circuit 40, but, for clarity of illustration, has been separated therefrom. Irrespective of its characterization, the array of multiplexers 42 outputs either the first or second set of digital bits responsive to the SEL command of the control circuit 40. Whichever set of digital bits is outputted, that set drives the array of equally weighted DAC units elements 52.

The array of equally weighted DAC units elements 52 may be voltage based, charge based, or current based, but is advantageously current based as shown in FIG. 4. Specifically, the set of digital bits output by the array of multiplexers 42 controls switches within the array of equally weighted DAC unit elements 52. These switches (not shown) control the current output $i_0, i_1, \ldots i_{n-2}, i_{n-1}$ of the array of equally weighted DAC unit elements 52 by steering a current source (not shown) to that output or to ground, or in a differential design either to a positive or negative output node. Implementing the array of equally weighted DAC unit elements 52 in this manner advantageously enhances the linearity of the digital-to-analog conversion circuit 10.

Regardless of its specific implementation, however, the array of equally weighted DAC unit elements 52 may advantageously be driven by one of the set of digital bits produced in FIG. 4. In FIG. 4, a binary to thermometer code converter 22 included in the first DAC 20 produces the first set of digital bits $x_0, x_1, \ldots x_{n-2}, x_{n-1}$ as thermometer coded bits of the digital signal. Driving the array of equally weighted DAC unit elements 52 with these thermometer coded bits relaxes the unit element matching requirements, without compromising the linearity of the circuit 10.

Also in FIG. 4, the second DAC 30 produces the second set of digital bits $y_0, y_1, \ldots y_{n-2}, y_{n-1}$ as delayed versions of a noise-shaped bit stream. More particularly, the second DAC 30 includes a noise shaping loop 32 which receives the digital signal or an upsampled version thereof. The noise shaping loop 32 may comprise, for example, an over-sampled noise shaping delta-sigma modulator that generates a low resolution, noise-shaped bit stream (e.g., shown in FIG. 4 as a 1-bit stream). This noise-shaped bit stream is, in turn, received by a cascaded set of delay elements 34 included in the second DAC 30. The cascaded set of delay elements 34 generates delayed versions of the noise-shaped bit stream as the second set of digital bits. Thus, as these delayed versions of the noise-shaped bit stream drive the array of equally weighted DAC unit elements 52, the second DAC 30 comprises a noise shaping FIR DAC with half digital, half analog FIR reconstruction filtering. See, e.g., U.S. Pat. No. 5,323,157 to Ledzius et al., which is incorporated herein by reference. To achieve FIR filter taps with different weights, the digital-to-analog conversion circuit 10 may be configured as shown in FIG. 5.

Figure 5:
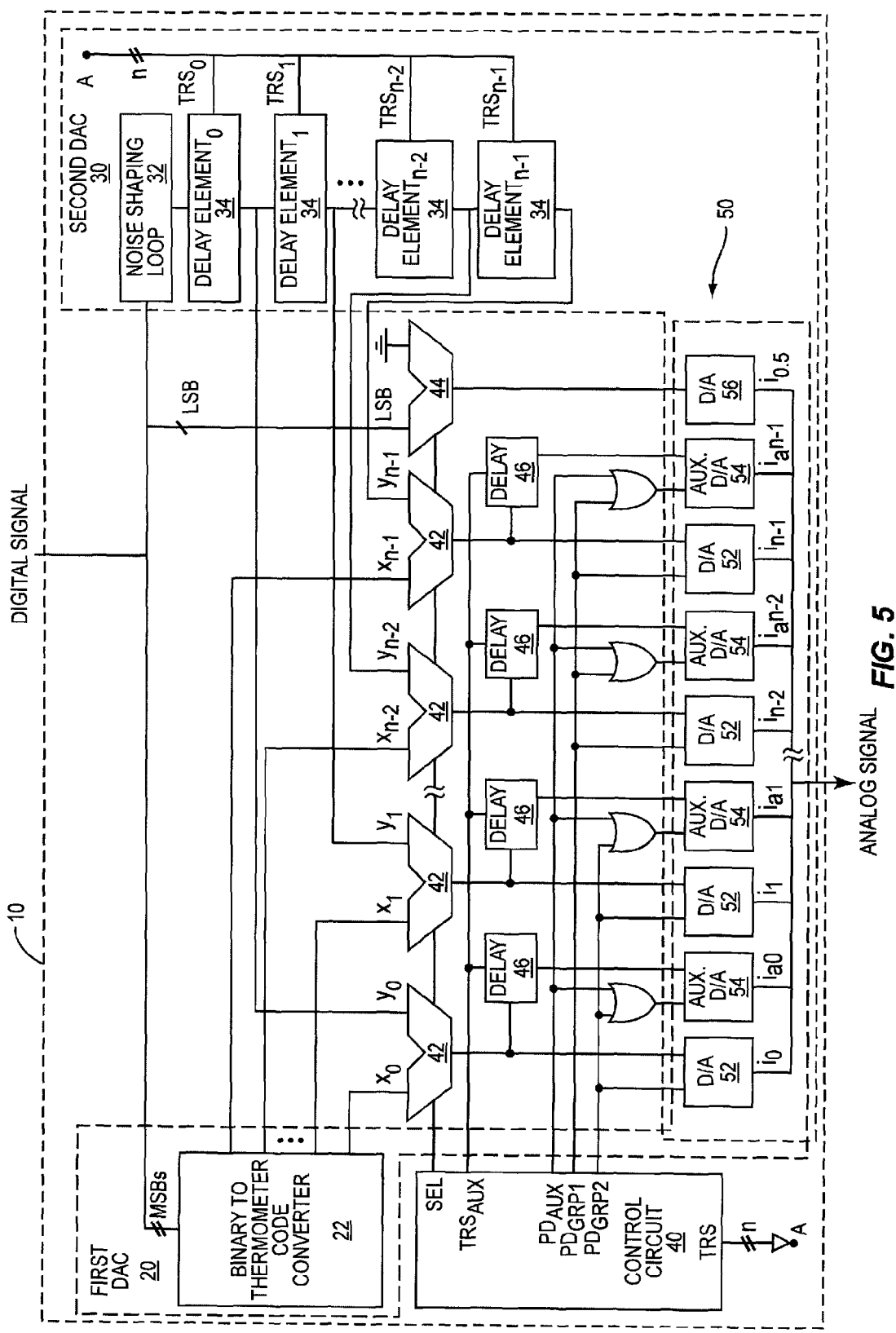
FIG. 5 is a schematic illustrating another embodiment of the digital-to-analog conversion circuit of FIG. 1.

In FIG. 5, the digital-to-analog conversion circuit 10 achieves FIR filter taps with different weights by controlling whether certain DAC unit elements 52 are connected in parallel. Specifically, the control circuit 40 further includes a delay element transparency command signal, TRS. The TRS command signal is a binary word whose individual bits (decoder not shown) control whether or not each individual delay element 34 is transparent. If controlled to be transparent, a delay element 34 does not delay the noise-shaped bit stream, and, therefore, outputs the same data bit as the previously cascaded delay element 34. In this manner, multiple DAC unit elements 52 are driven by the same data bit, resulting in a higher filter tap weight. Accordingly, the number of transparent delay elements 34 in succession determines the filter tap weight.

Controlling the FIR filter tap weights in this manner permits the second DAC 30 to further suppress conversion noise at a given out-of-band frequency. Yet even if the second DAC 30 is not selected by the control circuit 40, FIR filtering may still be implemented for the first DAC 20. In one embodiment, for example, the digital-to-analog conversion circuit 10 further includes an array of auxiliary DAC unit elements 54 and a set of auxiliary delays 46. An auxiliary delay transparency command, $TRS_{AUX}$, controls whether or not the set of auxiliary delays 46 operates transparently. If not operating transparently, the set of auxiliary delays 46 generates a delayed version of the set of digital bits output by the multiplexers 42 (e.g., the first set of digital bits). This delayed version of the digital bits, in turn, drives the array of auxiliary DAC unit elements 54 to implement FIR filtering.

Notably, however, the auxiliary DAC unit elements 54 add additional hardware to the conversion circuit 10 and increase overhead when not used for FIR filtering. Yet this overhead can be reduced by also using the auxiliary DAC unit elements 54 to enhance performance of the conversion circuit 10 in the presence of thermal noise. More specifically, when the set of auxiliary delays 46 operates transparently, it outputs the same data bits as that output by the multiplexers 42. In this case, the array of auxiliary DAC unit elements 54 is driven by the same data bits as that driving the array of equally weighted DAC unit elements 52. Driven by the same bits, the array of auxiliary DAC unit elements 54 provides additional current output for increased analog signal quality in the presence of thermal noise.

Generally, therefore, the array of auxiliary DAC unit elements 54 provides either FIR filtering or additional current responsive to the control circuit's 40 $TRS_{AUX}$ command signal. Of course, circumstances exist when neither FIR filtering or additional current is desired, and, thus, the array of auxiliary DAC unit elements 54 may be powered down responsive to the control circuit's 40 $PD_{AUX}$ command signal.

Likewise, any DAC unit elements 52, 54 may be powered down under other circumstances (examples of which are provided below) in order to reduce power consumption. Powering down may be implemented on an individual basis, or, to reduce design complexity and wiring, for a subset of the elements 52, 54. FIG. 5, for example, illustrates two group power down command signals, $PD_{GRP1}$ and $PD_{GRP2}$, which control whether certain subsets of the DAC unit elements 52, 54 are turned off.

Still other circumstances may require higher resolution of the first DAC 20. In one embodiment, therefore, the first DAC 20 comprises a segmented DAC. In this case, the more significant bits (MSBs) of the digital signal are thermometer coded bits, while the less significant bits (LSBs) remain binary bits. The control circuit 40 selects the first DAC by selecting to drive the array of equally weighted DAC unit elements 52 with the thermometer code bits and selecting to drive one or more binary weighted DAC unit elements with the LSB(s).

FIG. 5 illustrates this embodiment for a single LSB. Specifically, the MSBs of the digital signal are coded into thermometer coded bits by the binary to thermometer code converter 22, while the LSB of the digital signal remains a binary coded bit. When the control circuit 40 selects the first DAC via the SEL signal, the MSBs are selected by the multiplexers 42 to drive the array of equally weighted DAC unit elements 52 and the LSB is selected by the multiplexer 44 to drive the binary weighted DAC unit element 56.

The above described increase in DAC resolution and powering down of DAC unit elements 52, 54 finds particular utility in power control applications of a wireless communications transmitter. In this case, increasing the resolution of the first DAC 20 through segmentation permits the first DAC to provide acceptable analog signal quality despite low signal power. Furthermore, powering down of the unit elements 52, 54 can be used to reduce the conversion circuit's 10 power consumption during power back-off.

With the above and other points of variation and implementation flexibility in mind, those skilled in the art will appreciate that the present invention is not limited by the foregoing discussion or by the accompanying drawings. Indeed, the present invention is limited only by the following claims and their legal equivalents.

What is claimed is:

1. A digital-to-analog conversion circuit comprising:
    a first digital-to-analog converter, DAC, having a first out-of-band noise characteristic for a given out-of-band frequency;
    a second DAC having a second out-of-band noise characteristic for the given out-of-band frequency; and
    a control circuit configured to select either the first or the second DAC for digital-to-analog conversion of a digital signal based at least in part on a frequency distance between a frequency of the digital signal being converted and the given out-of-band frequency.

2. The digital-to-analog conversion circuit of claim 1 wherein the first DAC has a lower sampling rate than the second DAC, wherein the first and the second DAC produce different levels of conversion noise at a given frequency distance, and wherein the control circuit is configured to preferentially select the first DAC if the level of conversion noise produced by the first DAC at the given frequency distance is below a noise level tolerance.

3. The digital-to-analog conversion circuit of claim 1 wherein the second out-of-band noise characteristic is a noise shaped characteristic providing reduced noise for frequency distances within an effective noise reduction bandwidth, and wherein the control circuit is configured to preferentially select the second DAC for frequency distances within the effective noise reduction bandwidth.

4. The digital-to-analog conversion circuit of claim 1 wherein the digital-to-analog conversion circuit comprises part of a wireless communications transmitter of a wireless communications device, wherein the given out-of-band frequency comprises a receiving frequency of a wireless communications receiver of the wireless communications device, and wherein the wireless communications device is configured to vary the frequency distance based on operation according to one of a plurality of communication standards.

5. The digital-to-analog conversion circuit of claim 1 wherein the first DAC comprises an array of equally weighted DAC unit elements driven by a first set of digital bits and the second DAC comprises the array of equally weighted DAC unit elements driven by a second set of digital bits, and wherein the control circuit is configured to select the first or the second DAC by selecting to drive the array of equally weighted DAC unit elements with either the first or the second set of digital bits, respectively.

6. The digital-to-analog conversion circuit of claim 5 further comprising a binary-to-thermometer code converter that generates thermometer coded bits from the digital signal, a noise shaping loop that generates a noise-shaped bit stream from the digital signal, and a cascaded set of delay elements that generates delayed versions of the noise-shaped bit stream, and wherein the first set of digital bits comprises the thermometer coded bits and the second set of digital bits comprises the delayed versions of the noise-shaped bit stream.

7. The digital-to-analog conversion circuit of claim 6 wherein each delay element in the cascaded set of delay elements is configured to delay or not delay the noise-shaped bit stream responsive to a delay element control bit.

8. The digital-to-analog conversion circuit of claim 6 wherein the binary-to-thermometer code converter generates the thermometer coded bits from the more significant bits of the digital signal, wherein the first DAC further comprises one or more binary-weighted DAC unit elements driven by the less significant bits of the digital signal, and wherein the control circuit is configured to select the first DAC by selecting to drive the array of equally weighted DAC unit elements with the thermometer coded bits and the one or more binary-weighted DAC unit elements with the less significant bits of the digital signal.

9. The digital-to-analog conversion circuit of claim 5 wherein the control circuit is further configured to power down one or more of the DAC unit elements in the array of equally weighted DAC unit elements.

10. The digital-to-analog conversion circuit of claim 5 further comprising an array of auxiliary DAC unit elements and wherein the control circuit is further configured to select to drive the array of auxiliary DAC unit elements with a delayed version of the first or the second set of digital bits.

11. A method of converting a digital signal to an analog signal comprising
selectively converting the digital signal using a first digital-to-analog converter, DAC, having a first out-of-band noise characteristic for a given out-of-band frequency;
alternatively converting the digital signal using a second DAC having a second out-of-band noise characteristic for a given out-of-band frequency; and
selecting either the first or the second DAC based at least in part on a frequency distance between a frequency of the digital signal being converted and the given out-of-band frequency.

12. The method of claim 11 wherein selectively converting the digital signal using the first DAC comprises sampling the digital signal at a lower sampling rate and producing a different level of conversion noise at a given frequency distance than the second DAC, and wherein selecting either the first or the second DAC comprises preferentially selecting the first DAC if the level of conversion noise produced by the first DAC at the given frequency distance is below a noise level tolerance.

13. The method of claim 11 wherein selectively converting the digital signal using the second DAC comprises providing reduced noise for frequency distances within an effective noise reduction bandwidth, the second out-of-band noise characteristic being a noise shaped characteristic, and wherein selecting either the first or the second DAC comprises preferentially selecting the second DAC for frequency distances within the effective noise reduction bandwidth.

14. The method of claim 11 wherein the digital-to-analog conversion circuit comprises part of a wireless communications transmitter of a wireless communications device and the given out-of-band frequency comprises a receiving frequency of a wireless communications receiver of the wireless communications device, and wherein the method further comprises varying the frequency distance based on operation of the wireless communications device according to one of a plurality of communication standards.

15. The method of claim 11 wherein selectively converting the digital signal using the first DAC comprises selectively driving an array of equally weighted DAC unit elements with a first set of digital bits, wherein selectively converting the digital signal using the second DAC comprises selectively driving the array of equally weighted DAC unit elements with a second set of digital bits, and wherein selecting either the first or the second DAC comprises selecting to drive the array of equally weighted DAC unit elements with either the first or the second set of digital bits, respectively.

16. The method of claim 15 further comprising generating thermometer coded bits from the digital signal, generating a noise-shaped bit stream from the digital signal, and generating delayed versions of the noise-shaped bit stream, and wherein selectively converting the digital signal using the first DAC comprises selectively driving the array of equally weighted DAC unit elements with the thermometer coded bits and selectively converting the digital signal using the second DAC comprises selectively driving the array of equally weighted DAC unit elements with the delayed versions of the noise-shaped bit stream.

17. The method of claim 16 further comprising controlling the delay of the noise-shaped bit stream responsive to a set of delay control bits.

18. The method of claim 16 wherein generating the thermometer coded bits from the digital signal comprises generating the thermometer coded bits from the more significant bits of the digital signal, wherein selectively converting the digital signal using the first DAC further comprises selectively driving one or more binary-weighted DAC unit elements with the less significant bits of the digital signal, and wherein selecting the first DAC comprises selecting to drive the array of equally weighted DAC unit elements with the thermometer coded bits and the one or more binary-weighted DAC unit elements with the less significant bits of the digital signal.

19. The method of claim 15 further comprising powering down one or more of the DAC unit elements in the array of equally weighted DAC unit elements.

20. The method of claim 15 further comprising selecting to drive an array of auxiliary DAC unit elements with a delayed version of the first or second set of digital bits.

* * * * *

UNITED STATES PATENT AND TRADEMARK OFFICE
CERTIFICATE OF CORRECTION

| | | |
|---|---|---|
| PATENT NO. | : 7,893,856 B2 | Page 1 of 1 |
| APPLICATION NO. | : 12/423991 | |
| DATED | : February 22, 2011 | |
| INVENTOR(S) | : Ek et al. | |

It is certified that error appears in the above-identified patent and that said Letters Patent is hereby corrected as shown below:

In Column 6, Line 12, delete "circuit 10." and insert -- conversion circuit 10. --, therefor.

Signed and Sealed this
Twenty-fourth Day of May, 2011

David J. Kappos
*Director of the United States Patent and Trademark Office*